United States Patent
Itoh

(10) Patent No.: US 6,627,357 B2
(45) Date of Patent: Sep. 30, 2003

(54) RETICLE

(75) Inventor: Katsuyuki Itoh, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 62 days.

(21) Appl. No.: 09/837,721

(22) Filed: Apr. 17, 2001

(65) Prior Publication Data

US 2001/0033977 A1 Oct. 25, 2001

(30) Foreign Application Priority Data

Apr. 17, 2000 (JP) ........................... 2000-121054

(51) Int. Cl.7 .................................................. G03F 9/00
(52) U.S. Cl. ................................................... 430/5
(58) Field of Search ................................. 430/5

(56) References Cited

FOREIGN PATENT DOCUMENTS

| JP | 58-077270 | 5/1983 |
|---|---|---|
| JP | 60-007431 | 1/1985 |
| JP | 62-045026 | 2/1987 |
| JP | 06-118624 | 4/1994 |
| JP | 07-106764 | 4/1995 |

*Primary Examiner*—Christopher G. Young
(74) *Attorney, Agent, or Firm*—Katten Muchin Zavis Rosenman

(57) ABSTRACT

A reticle includes a first substrate including a first light-permeable substrate, and a first pattern formed on the first light-permeable substrate and having a first light transmittance, and a second substrate including a second light-permeable substrate, and a second pattern formed on the second light-permeable substrate and having a second light transmittance. The first and second substrates are coupled to each other such that the first and second patterns face each other. A part of the first and second patterns at which the first and second patterns overlap each other defines a light-impermeable pattern.

18 Claims, 6 Drawing Sheets

RETICLE

BACKGROUND OF THE INVENTION

1. Field of the Invention

The invention relates to a reticle or photomask used in photolithography, and more particularly to a reticle which is capable of forming a rectangular mask pattern with high accuracy.

2. Description of the Related Art

As a semiconductor device has been required to have a higher integration and a smaller size, a pattern to be formed on semiconductor device is also required to be reduced in a size.

In a method of fabricating a semiconductor device, photolithography steps are generally carried out. In order to increase a throughput and enable a semiconductor device to have an increased capacity, a unit for exposing a pattern to a light is required to expose a pattern to a light in a wide area at a time.

As a result, a minification ratio in the unit is reduced down to 4 from 5. In addition, a pattern is formed in a smaller size than before. Accordingly, it is necessary to reduce a size of a mask pattern formed on a reticle, resulting in an increase in difficulty in fabrication of a reticle.

There is an increased need for a highly accurate reticle. In particular, edges of a pattern or corners of a minute pattern in a reticle are likely to be rounded. Rounded edges or corners of a pattern would deteriorate an accuracy at which a pattern is formed on a semiconductor device, and further deteriorate a fabrication yield of a semiconductor device.

Specifically, since a pattern is formed on a reticle by etching a light-impermeable film formed on a transparent substrate by photolithography, it would be quite difficult to form a desired pattern with high accuracy, as a size of a pattern is reduced. In particular, sharpness in edges and/or corners is likely to be degraded due to diffraction and/or interference when a pattern is exposed to a light, resulting in that edges and/or corners of a pattern are rounded.

As a solution to such a problem, Japanese Unexamined Patent Publication No. 6-118624 has suggested a method of exposing a pattern to a light. In the suggested method, there are used a first reticle including a pattern extending in an X-axis direction, and a second reticle including a pattern extending in a Y-axis direction. A pattern is exposed twice to a light through the use of the first and second reticles. As a result, a pattern with high accuracy can be formed at an area having been exposed twice to a light.

However, the suggested method is accompanied with problems that a step of exposing a pattern to a light has to be carried out twice, and that it is necessary to make registration between the first and second reticles in the two steps of exposing a pattern to a light. If the registration is not made properly, it would be impossible to have a desired pattern with high accuracy.

Japanese Unexamined Patent Publication No. 60-7431 has suggested a reticle including a transparent plate, a first thin film pattern composed of opaque material and formed partially on a surface of the transparent plate, a transparent spacer formed on the surface of the transparent plate such that the spacer covers at least a part of the first thin film pattern therewith, and a second thin film pattern composed of opaque material and formed partially on the spacer.

Japanese Unexamined Patent Publication No. 62-45026 has suggested a method of fabricating a semiconductor integrated circuit, including the steps of exposing a resist to a light through a first mask having a pattern extending in a first direction, and exposing the resist to a light through a second make having a pattern extending in a second direction perpendicular to the first direction.

Japanese Patent Publication No. 4-56477 has suggested a method of fabricating a Josephson junction device including a lower electrode, an insulating film formed on the lower electrode and formed with a hole, a barrier layer formed above the lower electrode, and an upper electrode formed above the insulating film and the barrier layer. The method includes the steps of forming a first insulating film on the lower electrode through a first line resist pattern, removing the first line resist pattern to form a first hole in the form of a line, forming a second insulating film through a second line resist pattern intersecting with the first hole, and removing the second line resist pattern to thereby form a hole for making Josephson junction.

Japanese Unexamined Patent Publication No. 7-106764 has suggested a ceramic multi-layered circuit board including a plurality of first line patterns each comprised of broken lines with a space therebetween and extending in a X-axis direction, and a plurality of second line patterns each comprised of broken lines with a space and extending in a Y-axis direction. The first and second line patterns are arranged on a ceramic insulating layer in matrix such that the space defines a cross-point. The first and second line patterns sandwiching the cross-point therebetween are electrically connected to each other through a first hole formed through the ceramic insulating layer at the cross-point. The first hole does not reach a bottom surface of the ceramic insulating layer. The above-mentioned first and second line patterns are electrically connected to first and second patterns formed on a surface of a lower ceramic insulating layer, through a via-hole formed throughout the ceramic insulating layer at the cross-point.

The problem that a rectangular pattern cannot be formed with high accuracy remains unsolved even in the above-mentioned Publications.

SUMMARY OF THE INVENTION

In view of the above-mentioned problems, it is an object of the present invention to provide a reticle which can expose a rectangular pattern to a light with high accuracy without increasing complexity in a step of exposing a pattern to a light.

There is provided a reticle including (a) a first substrate including a first light-permeable substrate, and a first pattern formed on the first light-permeable substrate and having a first light transmittance, and (b) a second substrate including a second light-permeable substrate, and a second pattern formed on the second light-permeable substrate and having a second light transmittance, the first and second substrates being coupled to each other such that the first and second patterns face each other, a part of the first and second patterns at which the first and second patterns overlap each other, defining a light-impermeable pattern.

It is preferable that the first and second patterns are composed of the same material.

For instance, the light-impermeable pattern may be a rectangular pattern.

It is preferable that the first and second light transmittances are equal to or smaller than 0.7.

It is preferable that the reticle further includes a light-permeable adhesive layer to be sandwiched between the first and second substrates for coupling the first and second substrates together, in which case, the light-permeable adhesive layer is formed preferably in an area at which the first and second patterns do not overlap each other.

There is further provided a reticle including (a) a first substrate including a first light-permeable substrate formed at a surface thereof with first recesses in a pattern, and a first pattern formed in the first recesses and having a first light transmittance, and (b) a second substrate including a second light-permeable substrate formed at a surface thereof with second recesses in a pattern, and a second pattern formed in the second recesses and having a second light transmittance, the first and second substrates being coupled to each other such that the first and second patterns face each other, a part of the first and second patterns at which the first and second patterns overlap each other, defining a light-impermeable pattern.

There is still further provided a reticle including (a) a first substrate including a first light-permeable substrate, and a first pattern formed on the first light-permeable substrate and having a first light transmittance, and (b) a second substrate including a second light-permeable substrate formed at a surface thereof with second recesses in a pattern, and a second pattern formed in the second recesses and having a second light transmittance, the first and second substrates being coupled to each other such that the first and second patterns face each other, a part of the first and second patterns at which the first and second patterns overlap each other, defining a light-impermeable pattern.

The advantages obtained by the aforementioned present invention will be described hereinbelow.

In accordance with the present invention, the reticle includes a light-impermeable pattern defined by an area in which the first and second patterns overlap each other. In particular, corners of a rectangular pattern are defined by intersection of a side of the first pattern with a side of the second pattern. As a result, it would be possible to have a reticle presenting a highly accurate rectangular pattern unlike a conventional reticle which presents a rectangular pattern having rounded corners.

In addition, a rectangular pattern could be exposed to a light through one reticle in only one exposure step. This means that the number of steps of exposing a pattern to a light is not increased in comparison with a conventional method, and that it is no longer necessary to make registration between two reticles. Hence, it is ensured to simplify the exposure step and avoid reduction in an accuracy of a rectangular pattern which reduction is caused by error in registration of two reticles.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1A:
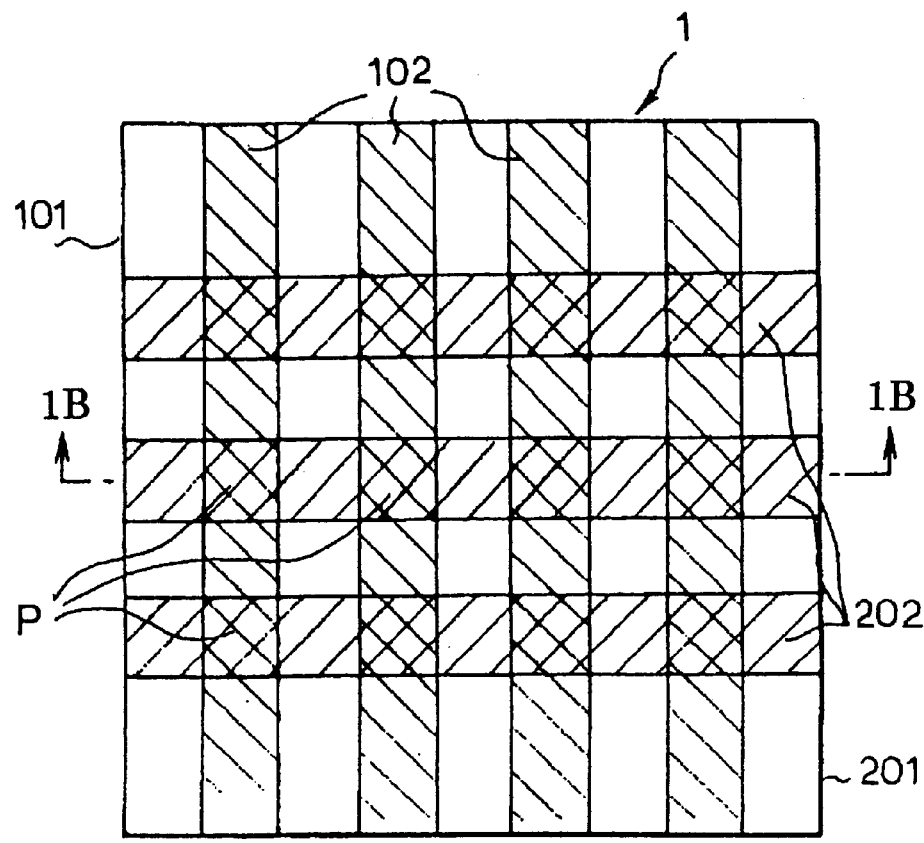
FIG. 1A is a top view of a reticle in accordance with the first embodiment of the present invention.
Figure 1B:
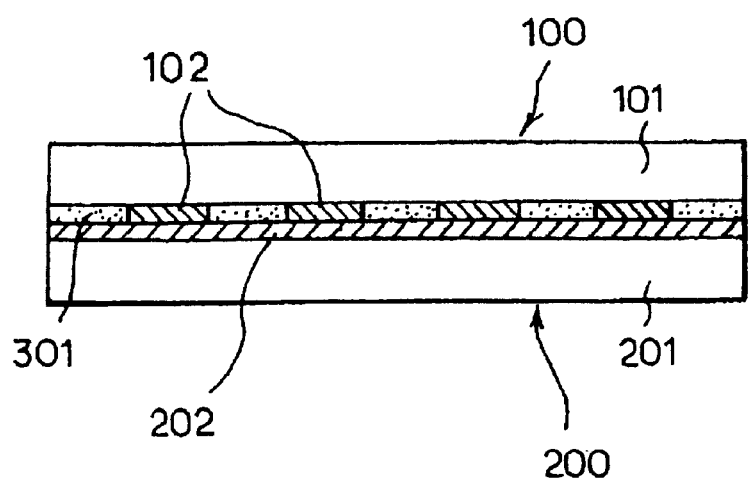
FIG. 1B is a cross-sectional view taken along the line 1B—1B in FIG. 1A.
Figure 2:
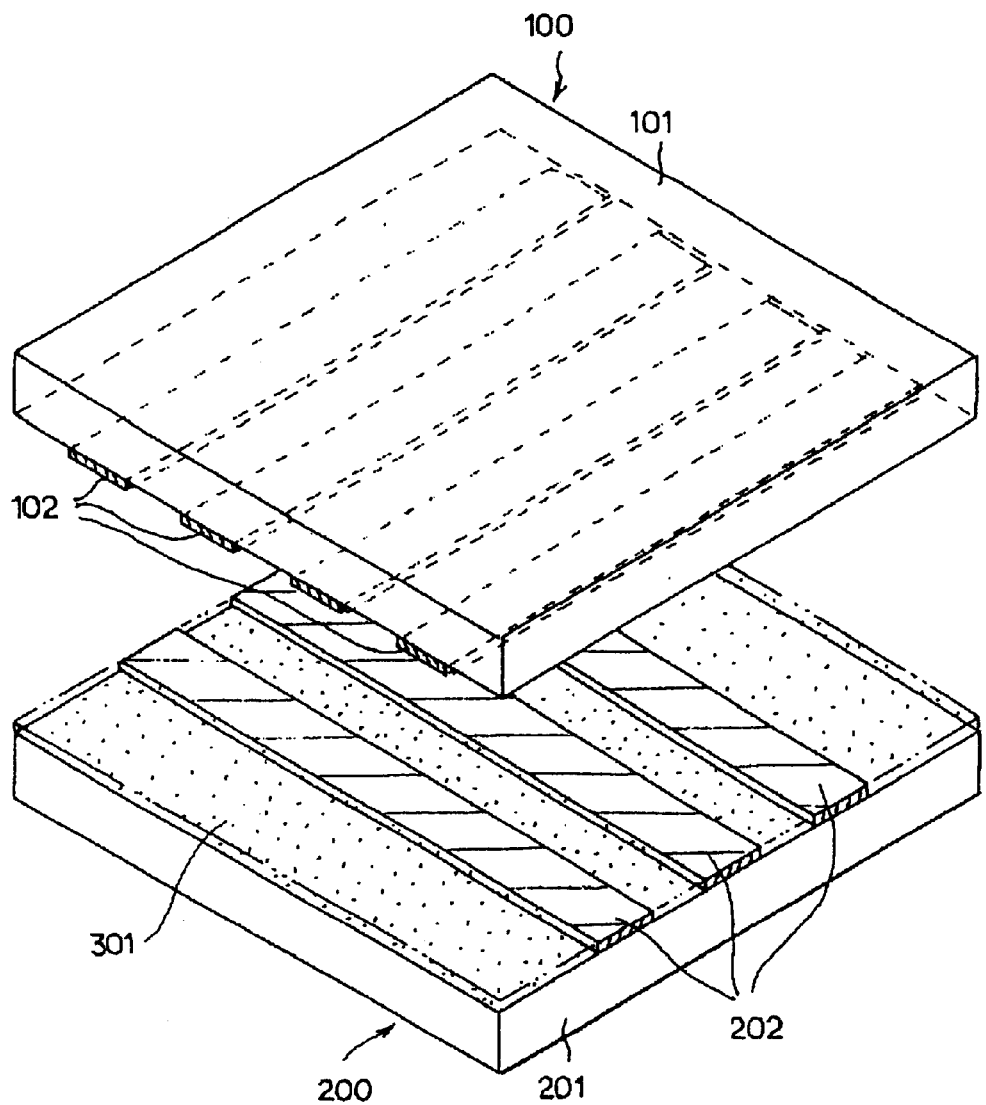
FIG. 2 is an exploded perspective view of the reticle illustrated in FIGS. 1A and 1B.

FIGS. 1A, 1B and 2 illustrate a reticle 1 in accordance with the first embodiment. FIG. 1A is a top view of the reticle 1, FIG. 1B is a cross-sectional view taken along the line 1B—1B in FIG. 1A, and FIG. 2 is an exploded perspective view of the reticle 1.

In the first embodiment, a pattern formed on the reticle 1 includes minute square patterns arranged in matrix at a predetermined pitch in both X and Y-axes directions.

The reticle 1 is comprised of a first substrate 100, a second substrate 200 coupled to the first substrate 100, and an adhesive layer 301 for coupling the first and second substrates 100 and 200.

The first substrate 100 is comprised of a first transparent glass substrate 101, and a plurality of first line patterns 102 formed on a surface of the first transparent glass substrate 101. The first line patterns 102 are composed of material having a low light transmittance such as a metal. For instance, the first line patterns 102 are composed of chromium (Cr). The first line patterns 102 extend in a Y-axis direction at a predetermined pitch measured in a X-axis direction. The first line patterns 102 have a predetermined width.

The second substrate 200 is comprised of a second transparent glass substrate 201, and a plurality of second line patterns 202 formed on a surface of the second transparent glass substrate 201. The second line patterns 202 are composed of material having a low light transmittance such as a metal. For instance, the second line patterns 202 are composed of chromium (Cr). The n second line patterns 202 extend in X-axis direction at the same pitch measured in a Y-axis direction as the pitch of the first line patterns 102. The second line patterns 202 have the same width as the width of the first line patterns 102.

The first and second substrates 100 and 200 are coupled to each other such that the first and second line patterns 102 and 202 face each other.

Hereinbelow is explained a method of forming the first line patterns 102 on the first transparent glass substrate 101, with reference to FIGS. 3A to 3D. The second line patterns 202 are formed in the same way as the first line patterns 102.

Figure 3A:
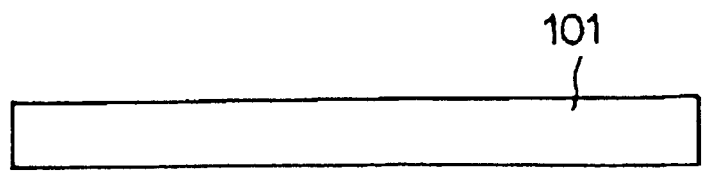
FIGS. 3A to 3D are cross-sectional views of the reticle, illustrating respective steps of a method of fabricating the reticle in accordance with the first embodiment.

First, as illustrated in FIG. 3A, there is prepared the first transparent glass substrate 101.

Figure 3B:
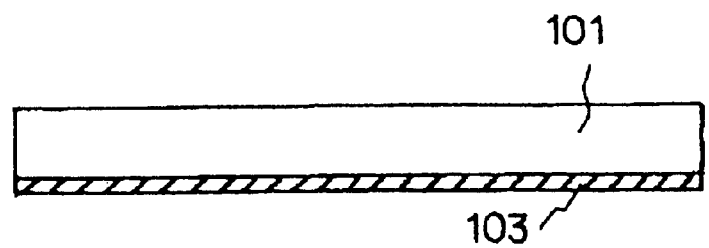

Then, as illustrated in FIG. 3B, a metal film 103 is formed on the first transparent glass substrate 101.

Figure 3C:
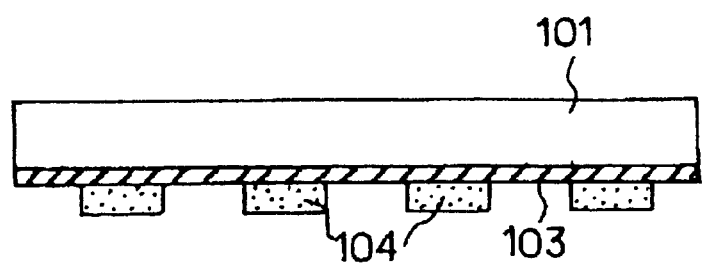

Then, a photoresist film 104 is formed entirely over the metal film 103, and then, exposed to a light in the same pattern as the first line patterns 102. Then, the photoresist film 104 is developed. Thus, the photoresist film 104 is patterned in such a pattern as illustrated in FIG. 3C.

Figure 3D:
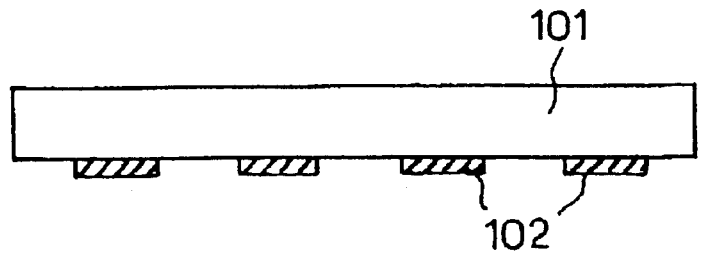

Then, as illustrated in FIG. 3D, the metal film 103 is etched with the patterned photoresist film 104 being used as a mask.

Thus, there is formed the first line patterns 102 on the first transparent glass substrate 101.

A thickness of the metal film 103 or the first line patterns 102 is determined such that the resultant first line patterns 102 have a light transmittance equal to or smaller than about 70%.

The first and second substrates 100 and 200 are adhered to each other such that the first and second line patterns 102 and 202 face each other.

The first and second substrates 100 and 200 are coupled to each other, as follows.

First, the adhesive layer composed of curable transparent material such as glass or quartz is coated onto the first and/or second transparent substrates 101, 201. Then, the first and second substrates 100 and 200 are made to make close contact with each other. Then, the adhesive layer 301 is heated. By being heated, the adhesive layer 301 is cured to thereby fixate the first and second substrates 100 and 200 to each other.

Though the adhesive layer 301 may be formed entirely over the first and/or second transparent glass substrates 101 and 201, it is preferable that the adhesive layer 301 is formed in areas in which the first and second line patterns 102 and 202 do not overlap each other.

In accordance with the reticle 1 having the above-mentioned structure, the first and second substrates 100 and 200 are coupled to each other, and resultingly, square patterns P are formed in matrix at areas in which the first and second line patterns 102 and 202 overlap each other. Each of the square patterns P has a side having a length equal to a width of the first and second line patterns 102 and 202.

In the first substrate 100, the first line patterns 102 has a light transmittance of about 70%, and an area other than the first line patterns 102 has a light transmittance of about 100%.

Similarly, in the second substrate 200, the second line patterns 202 has a light transmittance of about 70%, and an area other than the second line patterns 202 has a light transmittance of about 100%.

Accordingly, the square patterns P in which the first and second line patterns 102 and 202 overlap each other has a light transmittance of 0.49 (0.7×0.7). An area covered with the first or second line patterns 102 or 202, other than the square patterns P, has a light transmittance of about 70%, and an area not covered with the first and second line patterns 102 and 202 has a light transmittance of about 100%.

Hence, when a photoresist film is to be exposed to a light through the reticle 1, a light emitted from a light source is designed to have such an intensity that the photoresist film is exposed to light at a light intensity equal to about 50 to 60% or greater of an intensity of a light passing through the reticle 1. By so designing a light emitted from a light source, a light passing through the square patterns P is not exposed to light at the photoresist film, and a light passing through areas other than the square patterns P is exposed to light at the photoresist film.

Thus, a photoresist film can be exposed to a light such that the square patterns P arranged in matrix define light-impermeable zones.

In accordance with the first embodiment, a plurality of rectangular patterns could be exposed to a light through one reticle in only one exposure step. This means that the number of steps of exposing a pattern to a light is not increased in comparison with a conventional method, and that it is no longer necessary to make registration between two reticles. Hence, it is ensured to simplify the photolithography step and avoid reduction in an accuracy of a rectangular pattern which reduction is caused by error in registration of two reticles.

In addition, the reticle 1 includes the light-impermeable patterns P defined by an area in which the first and second patterns 102 and 202 overlap each other. In particular, corners of the square patterns P are defined by intersection of sides of the first line patterns 102 with sides of the second line patterns 202. As a result, it would be possible to form a highly accurate square pattern unlike a conventional reticle which presents a rectangular pattern having rounded corners.

Figure 4A:
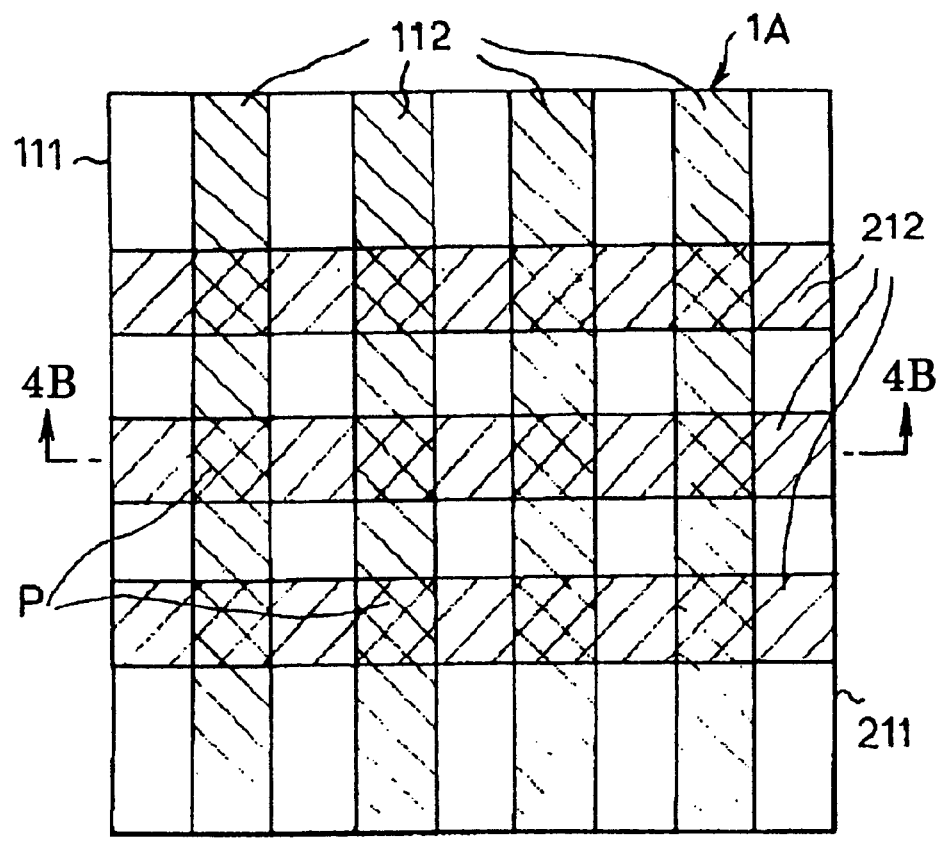
FIG. 4A is a top view of a reticle in accordance with the second embodiment of the present invention.
Figure 4B:
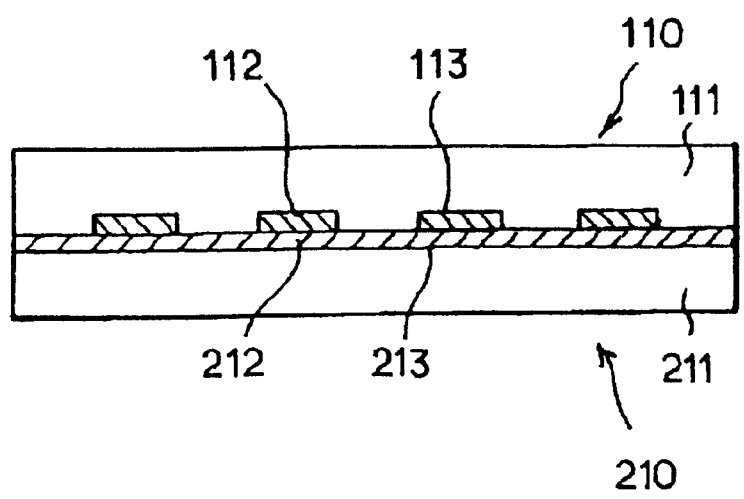
FIG. 4B is a cross-sectional view taken along the line 4B—4B in FIG. 4A.
Figure 5:
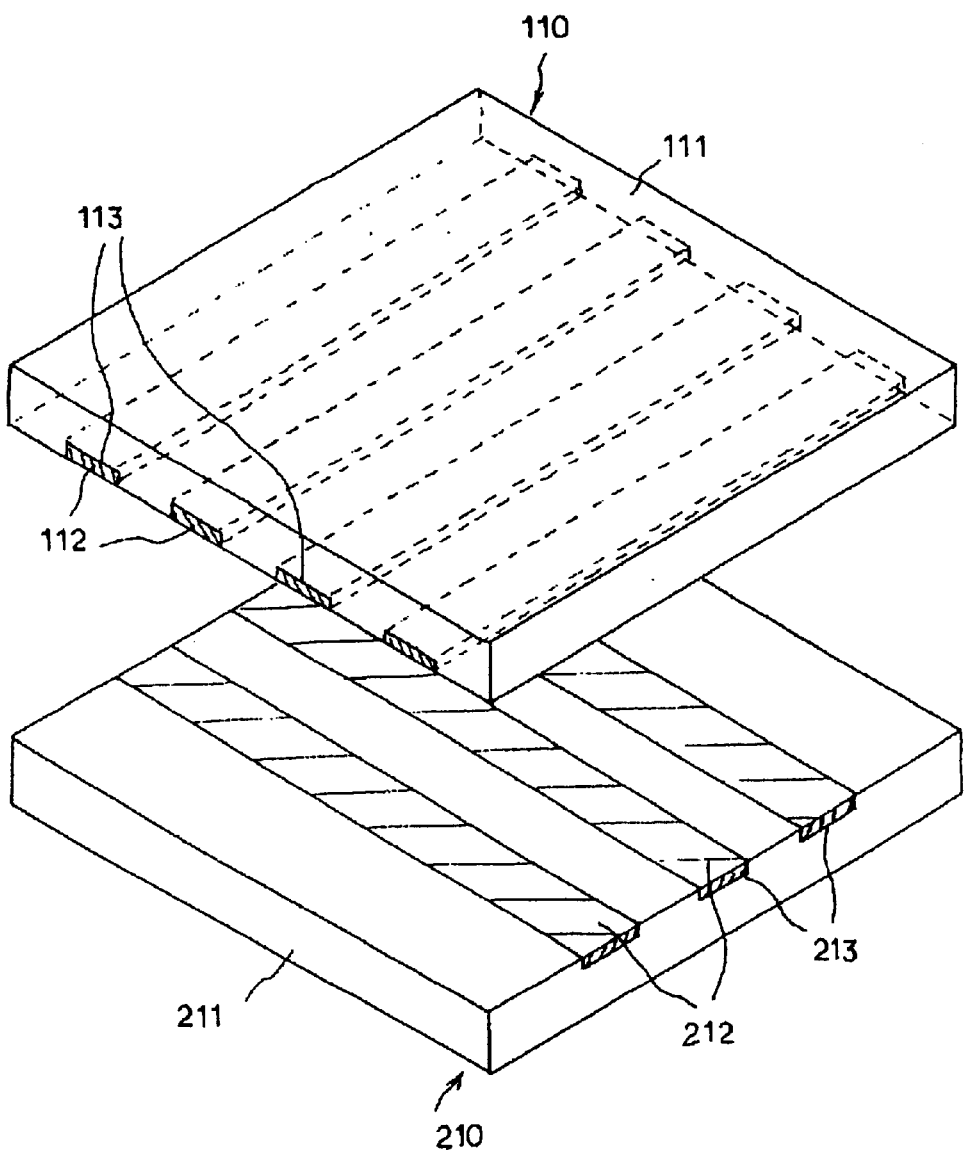
FIG. 5 is an exploded perspective view of the reticle illustrated in FIGS. 4A and 4B.

FIGS. 4A, 4B and 5 illustrate a reticle 1A in accordance with the second embodiment. FIG. 4A is a top view of the reticle 1A, FIG. 4B is a cross-sectional view taken along the line 4B—4B in FIG. 4A, and FIG. 5 is an exploded perspective view of the reticle 1A.

The reticle 1A is comprised of a first substrate 110, a second substrate 210 coupled to the first substrate 110, and an adhesive layer (not illustrated) for coupling the first and second substrates 110 and 210.

The first substrate 110 is comprised of a first transparent glass substrate 111 formed at a surface thereof with recesses 113 extending in a Y-axis direction at a predetermined pitch measured in a X-axis direction, and a plurality of first line patterns 112 formed in the recesses 113. The first line patterns 112 are composed of material having a low light transmittance such as a metal. For instance, the first line patterns 112 are composed of chromium (Cr). The first line patterns 112 have a predetermined width.

The second substrate 210 is comprised of a second transparent glass substrate 211 formed at a surface thereof with recesses 213 extending in a X-axis direction at a predetermined pitch measured in a Y-axis direction, and a plurality of second line patterns 212 formed in the recesses 213. The second line patterns 212 are composed of material having a low light transmittance such as a metal. For instance, the second line patterns 212 are composed of chromium (Cr). The second line patterns 212 have the same width as the width of the first line patterns 112.

The first and second substrates 110 and 210 are coupled to each other such that the first and second line patterns 112 and 212 face each other with an adhesive layer (not illustrated) being sandwiched therebetween.

Hereinbelow is explained a method of forming the first line patterns 112 on the first transparent glass substrate 111, with reference to FIGS. 6A to 6D. The second line patterns 212 are formed in the same way as the first line patterns 112.

Figure 6A:
FIGS. 6A to 6D are cross-sectional views of the reticle, illustrating respective steps of a method of fabricating the reticle in accordance with the second embodiment.

First, as illustrated in FIG. 6A, there is prepared the first transparent glass substrate 111.

Figure 6B:
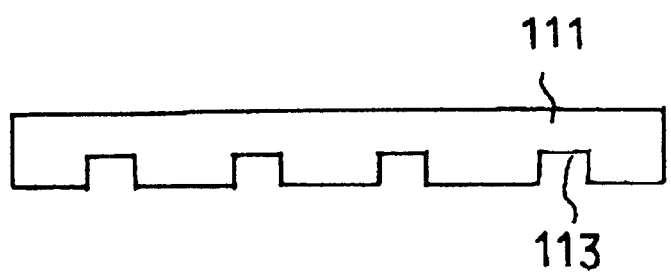

Then, as illustrated in FIG. 6B, the first transparent glass substrate 111 is etched in selected areas by photolithography through the use of a photoresist film (not illustrated), to thereby form the recesses 113 extending in a Y-axis direction.

Figure 6C:
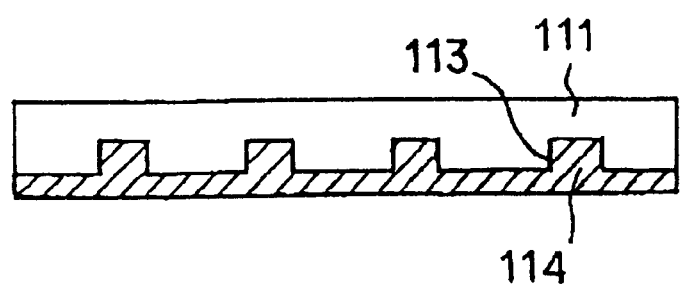

Then, as illustrated in FIG. 6C, a metal film 114 such as a chromium film is formed on the first transparent glass substrate 111 by evaporation or sputtering such that the metal film 114 has a thickness sufficient to fill the recesses 113 therewith.

Then, the metal film 114 is etched back or polished by chemical mechanical polishing (CMP) such that the metal film 114 remains only in the recesses 113.

Figure 6D:
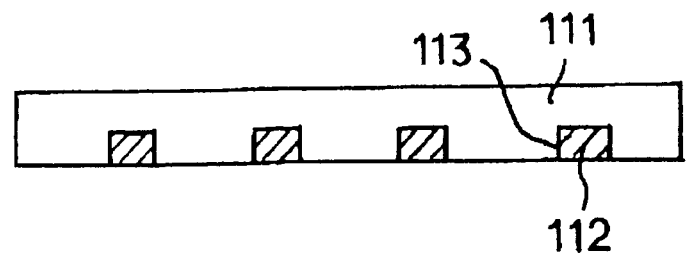

Thus, as illustrated in FIG. 6D, there are formed the first line patterns 112 buried in the recesses 113.

When the recesses 113 are formed at a surface of the first transparent glass substrate 111, the recesses 113 are designed to have such a depth that the first line patterns 112 composed of the metal film 114 has a light transmittance of about 70% or smaller.

In accordance with the reticle 1A having the above-mentioned structure, the first and second substrates 110 and 210 are coupled to each other, and resultingly, the square patterns P are formed in matrix at areas in which the first and second line patterns 112 and 212 overlap each other. Each of the square patterns P has a side having a length equal to a width of the first and second line patterns 112 and 212.

In the first substrate 110, the first line patterns 112 has a light transmittance of about 70%, and an area other than the first line patterns 112 has a light transmittance of about 100%.

Similarly, in the second substrate 210, the second line patterns 212 has a light transmittance of about 70%, and an area other than the second line patterns 212 has a light transmittance of about 100%.

Accordingly, the square patterns P in which the first and second line patterns 112 and 212 overlap each other has a light transmittance of 0.49 (0.7×0.7). An area covered with the first or second line patterns 112 or 212, other than the square patterns P, has a light transmittance of about 70%, and an area not covered with the first and second line patterns 112 and 212 has a light transmittance of about 100%.

Hence, when a photoresist film is to be exposed to a light through the reticle 1A, a light emitted from a light source is designed to have such an intensity that the photoresist film is exposed to light at a light intensity equal to about 50 to 60% or greater of an intensity of a light passing through the reticle 1A. By so designing a light emitted from a light source, a light passing through the square patterns P is not exposed to light at the photoresist film, and a light passing through areas other than the square patterns P is exposed to light at the photoresist film.

Thus, a photoresist film can be exposed to a light such that the square patterns P arranged in matrix define light-impermeable zones.

In accordance with the second embodiment, a plurality of rectangular patterns could be exposed to a light through one reticle in only one exposure step. This means that the number of steps of exposing a pattern to a light is not increased in comparison with a conventional method, and that it is no longer necessary to make registration between two reticles. Hence, it is ensured to simplify the photolithography step and avoid reduction in an accuracy of a rectangular pattern which reduction is caused by error in registration of two reticles.

In addition, the reticle 1A includes the light-impermeable patterns P defined by an area in which the first and second patterns 112 and 212 overlap each other. In particular, corners of the square patterns P are defined by intersection of sides of the first line patterns 112 with sides of the second line patterns 212. As a result, it would be possible to form a highly accurate square pattern unlike a conventional reticle which presents a rectangular pattern having rounded corners.

Since the first and second line patterns 112 and 212 are buried in the recesses 113 and 213 in the second embodiment, the second embodiment can avoid a pattern defect more readily than the first embodiment in which a pattern defect is likely to occur in a line pattern formed by etching a metal film.

In addition, in accordance with the second embodiment, when the first and second substrates 110 and 210 are coupled to each other, there is formed no gap which would be caused due to line patterns such as the first and second line patterns 102 and 202 in the first embodiment, between the first and second substrates 110 and 210. This ensures close contact between the first and second substrates 110 and 210, and enhanced accuracy of the square patterns P.

Though the reticles 1 and 1A in accordance with the above-mentioned first and second embodiments define the square patterns P arranged in matrix, the reticles 1 and 1A may be designed to define any other rectangular patterns arranged in any pattern.

For instance, when rectangular patterns each having a length of X1 and a width of X2 are to be formed, the first line patterns 112 each having a width of X1 are formed on the first transparent glass substrate 111 and the second line patterns 212 each having a width of X2 are formed on the second transparent glass substrate 211 such that the first and second line patterns 112 and 212 perpendicularly intersect with each other. The thus formed rectangular patterns do not have rounded corners unlike the rectangular patterns formed in accordance with the conventional methods, but have corners having just 90 degrees.

Though the first and second line patterns 102 and 202 are formed on the first and second transparent glass substrates 101 and 201 in the first embodiment, and the first and second line patterns 202 and 212 are formed in the recesses 113 and 213 in the second embodiment, the reticle may be designed to include the first and second patterns formed on one of the first and second transparent glass substrates, and the first and second patterns formed in the recesses formed with the other of the first and second transparent glass substrates. This reticle simplifies fabrication steps in comparison with the second embodiment, and in addition, reduces a gap between the first and second transparent glass substrates in comparison with the first embodiment, ensuring close contact between the first and second transparent glass substrates.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-121054 filed on Apr. 17, 2000 including specification, claims, drawings and summary is incorporated herein by reference in its entirety.

What is claimed is:

1. A reticle comprising:
   (a) a first substrate including a first light-permeable substrate, and a first pattern formed on said first light-permeable substrate and having a first light transmittance less than a light transmittance of said first light-permeable substrate; and
   (b) a second substrate including a second light-permeable substrate, and a second pattern formed on said second light-permeable substrate and having a second light transmittance less than a light transmittance of said second light-permeable substrate, said first and second substrates being coupled to each other such that said first and second patterns face each other, a part of said first and second patterns at which said first and second patterns overlap each other, defining a light-impermeable pattern.

2. The reticle as set forth in claim 1, wherein said first and second patterns are composed of the same material.

3. The reticle as set forth in claim 1, wherein said light-impermeable pattern is a rectangular pattern.

4. The reticle as set forth in claim 1, wherein said first and second light transmittances are equal to or smaller than 0.7.

5. The reticle as set forth in claim 1, further comprising a light-permeable adhesive layer to be sandwiched between said first and second substrates for coupling said first and second substrates together.

6. The reticle as set forth in claim 5, wherein said light-permeable adhesive layer is formed in an area at which said first and second patterns do not overlap each other.

7. A reticle comprising:
(a) a first substrate including a first light-permeable substrate formed at a surface thereof with first recesses in a pattern, and a first pattern formed in said first recesses and having a first light transmittance less than a light transmittance of said first light-permeable substrate; and
(b) a second substrate including a second light-permeable substrate formed at a surface thereof with second recesses in a pattern, and a second pattern formed in said second recesses and having a second light transmittance less than a light transmittance of said second light-permeable substrate, said first and second being coupled to each other such that said first and second patterns face each other, a part of said first and second patterns at which said first and second patterns overlap each other, defining a light-impermeable pattern.

8. The reticle as set forth in claim 7, wherein said first and second patterns are composed of the same material.

9. The reticle as set forth in claim 7, wherein said light-impermeable pattern is a rectangular pattern.

10. The reticle as set forth in claim 7, wherein said first and second light transmittances are equal to or smaller than 0.7.

11. The reticle as set forth in claim 7, further comprising a light-permeable adhesive layer to be sandwiched between said first and second substrates for coupling said first and second substrates together.

12. The reticle as set forth in claim 11, wherein said light-permeable adhesive layer is formed in an area at which said first and second patterns do not overlap each other.

13. A reticle comprising:
(a) a first substrate including a first light-permeable substrate, and a first pattern formed on said first light-permeable substrate and having a first light transmittance less than a light transmittance of said first light-permeable substrate; and
(b) a second substrate including a second light-permeable substrate formed at a surface thereof with second recesses in a pattern, and a second pattern formed in said second recesses and having a second light transmittance less than a light transmittance of said second light-permeable substrate, said first and second substrates being coupled to each other such that said first and second patterns face each other, a part of said first and second patterns at which said first and second patterns overlap each other, defining a light-impermeable pattern.

14. The reticle as set forth in claim 13, wherein said first and second patterns are composed of the same material.

15. The reticle as set forth in claim 13, wherein said light-impermeable pattern is a rectangular pattern.

16. The reticle as set forth in claim 13, wherein said first and second light transmittances are equal to or smaller than 0.7.

17. The reticle as set forth in claim 13, further comprising a light-permeable adhesive layer to be sandwiched between said first and second substrates for coupling said first and second substrates together.

18. The reticle as set forth in claim 17, wherein said light-permeable adhesive layer is formed in an area at which said first and second patterns do not overlap each other.

* * * * *